United States Patent [19]

Franz et al.

[11] Patent Number: 5,583,798

[45] Date of Patent: Dec. 10, 1996

[54] POSITION MEASURING METHOD AND APPARATUS FOR GENERATING PERIODIC SIGNALS FREE OF HARMONICS

[75] Inventors: Andreas Franz, Trostberg; Wolfgang Holzapfel, Obing, both of Germany

[73] Assignee: Dr. Johannes Heidenhain GmbH, Traunreut, Germany

[21] Appl. No.: 286,702

[22] Filed: Aug. 5, 1994

[30] Foreign Application Priority Data

Aug. 7, 1993 [EP] European Pat. Off. .............. 93112703

[51] Int. Cl.[6] .................................................. G01B 11/14
[52] U.S. Cl. ....................... 364/561; 33/707; 356/375; 364/525; 377/24
[58] Field of Search ........................... 364/525, 550, 364/560, 561, 571.01; 356/374, 375; 377/3, 24; 33/706, 707; 250/237 R, 237 G; 341/13

[56] References Cited

U.S. PATENT DOCUMENTS

| | | |
|---|---|---|
| 3,674,372 | 7/1972 | Weyrauch . |
| 4,225,931 | 9/1980 | Schwefel .................. 364/577 |
| 4,297,033 | 10/1981 | Nelle ...................... 356/374 |
| 4,595,991 | 6/1986 | Spies ...................... 364/525 |
| 4,602,436 | 7/1986 | Ernst ....................... 33/707 |
| 5,332,896 | 7/1994 | Holzapfel ............... 250/237 G |

FOREIGN PATENT DOCUMENTS

| | | |
|---|---|---|
| 1941731 | 3/1971 | Germany . |
| 2729697 | 1/1979 | Germany . |
| 3239108 | 4/1984 | Germany . |
| 3412128 | 5/1985 | Germany . |

*Primary Examiner*—Ellis B. Ramirez
*Assistant Examiner*—Edward Pipala
*Attorney, Agent, or Firm*—Brinks Hofer Gilson & Lione

[57] ABSTRACT

A position measuring method and apparatus for obtaining signals substantially free of harmonics with the aid of a periodic graduation and a non-periodic or aperiodic scanning graduation, wherein the position of the grating lines n within the scanning graduation is determined in accordance with a statistical distribution.

20 Claims, 2 Drawing Sheets 5,583,798

POSITION MEASURING METHOD AND APPARATUS FOR GENERATING PERIODIC SIGNALS FREE OF HARMONICS

FIELD OF THE INVENTION

The present invention relates to a method and apparatus for obtaining substantially harmonic free periodic signals in an incremental or absolute measuring system. The substantially harmonic free signals are generated by scanning a periodic graduation with at least one non-periodic scanning graduation, where the grating lines of the scanning graduation have a grating line displacement with respect to the periodic graduation.

BACKGROUND OF THE INVENTION

A variety of photoelectric, magnetic, inductive and capacitive measuring systems are known to the art for measuring the relative position of two objects, such as the relative position between a slide piece and a bed of a machine tool, for example. While there are distinctions between photoelectric, magnetic, inductive and capacitive scanning, all methods have a common basic principle, a periodic graduation is scanned and the scanning signal generated in this way is evaluated as the measuring signal.

In the case of prior art photoelectric length measuring systems, a measuring scale which defines a periodic graduation is mounted to a first object and this scale is scanned by a scanning unit which is connected with a second object. The scanning unit includes for this purpose an illuminating system and a scanning plate which may, for example, include two graduation fields. The graduations of these fields are typically offset with respect to one another by a phase angle of 90° and correspond precisely in period with the graduation of the measuring scale. In addition, the scanning unit includes, for example, two photosensors, each of which is associated with a respective one of the graduation fields.

In the case of transmitted light measuring systems, the similar graduations on the scanning plate and the measuring scale are made up of alternating photopermeable and photoimpermeable strips which alternate along the longitudinal extent of the measuring scale (the measuring direction).

The light flux generated by the illumination system passes through the graduations of the measuring scale and the scanning plate and then falls upon the photosensors. Thus, the light falling on the photosensors is modulated by the relative movement of the scanning plate with respect to the measuring scale. The two photosensors associated with respective ones of the graduation fields generate two periodic electric analog signals which are phase shifted with respect to one another by a phase angle of 90° and are sinusoidal in wave form. These sinusoidal analog signals are applied as inputs to an evaluating arrangement which determines the measured position value from the analog signals. The period of the analog signals generated by the scanning unit is determined by the period of the graduation of the measuring scale. This period is in turn determined by the width of the alternating photopermeable and photoimpermeable strips along the measuring direction. In relative movement between the scanning unit and the measuring scale, each period of the graduation of the measuring scale results in the generation of a counting pulse which is counted and displayed.

In general, the periodic analog signals obtained from the graduations of a measuring scale in photoelectric, magnetic, inductive, and capacitive measuring systems are not precisely sinusoidal in wave form. Rather, in general, such periodic analog signals include harmonic components as a consequence of inaccuracies in the graduations. Such inaccuracies can result, for example, from differing spacings between the photopermeable and the photoimpermeable strips of the graduations, or by an edge blurring of these strips.

One prior art approach to minimize the harmonic components in the analog scanning signal is to place high precision demands on the accuracy of the graduation. If the periodic analog signals are to be used to form exact position measuring values for each graduation period and to provide improved measuring precision by subdividing the graduation periods of the graduation through the formation of interpolation values, the analog signals obtained from the graduation must be substantially free of harmonics. The prior art discloses several approaches to the formation of such interpolation values, such as the computer based approach described in U.S. Pat. No. 4,225,931 which is specifically incorporated herein by reference.

In addition to the measuring systems described above, other classes of prior art measuring systems generate triangular or trapezoidal analog measuring signals, which by their very nature include a large harmonic component.

U.S. Pat. No. 3,674,372 which is specifically incorporated herein by reference discloses a photoelectric length measuring system in which harmonic components in the analog signal generated in the scanning of the graduation of the measuring scale are reduced by means of a frequency filter diaphragm having a sinusoidal permeability characteristic. In this measuring system it is necessary for a special frequency filter diaphragm to be produced and installed on the measuring system. Moreover, this approach to the reduction of harmonic components is restricted to use in photoelectric measuring systems which operate according to the transmitted light measuring principle.

U.S. Pat. No. 4,595,991 which is specifically incorporated herein by reference discloses a position measuring system and method for generating harmonic-free periodic signals of the type comprising a measuring scale which includes a periodic graduation and a scanning unit adapted to scan the measuring scale with at least 2N scanning elements. Each of the scanning elements is included in the scanning unit to scan the periodic graduation and to generate a respective periodic scanning signal in response thereto. The number of scanning elements is selected at twice the bandwidth N of the scanning signals generated by the scanning elements. A Fourier analysis is performed on the scanning signals to determine a pair of Fourier coefficients characteristic of the fundamental component of the scanning signals. These Fourier coefficients are evaluated as substantially harmonic-free periodic signals to determine the position of the scanning unit with respect to the measuring scale.

U.S. Pat. No. 4,602,436 which is specifically incorporated herein by reference discloses a measuring system in which harmonic-free periodic signals are recovered, which does not require special optical elements and which can be used in direct light and in reflected light measuring systems. The position measuring system is provided with at least two first scanning fields included in the scanning unit, offset with respect to one another along the measuring direction. Each scanning field comprises N partial fields, where N is the bandwidth of the periodic analog signal. Adjacent partial fields are displaced with respect to one another by a constant dimension in the measuring direction, and each of the partial fields defines a respective width along the measuring direction. The widths of the partial fields vary according to a sine function. In addition, means are provided for developing first periodic signals from the partial fields and for superposing the first periodic signals to generate a harmonic-free periodic analog signal. Alternatively, the scanning fields each define respective scanning field midlines and the scanning field midlines are offset with respect to one another along the measuring direction. Each scanning field comprises M partial fields where M is greater than or equal to N. These partial fields are positioned such that the separation in the measuring direction between the partial field midlines and the scanning field midlines varies according to an arcsin function and each of the partial fields defines a constant width.

Many of these methods, for example, Vernier, Vernier-arcsin or multi-field filtering are based on a special scanning graduation. The grating line positions $X_n$ (where n is the grating line index of the scanning graduation) are respectively displaced by a small amount $\delta_n$ in relation to the nominal position defined as n·P where P is the graduation period of the measuring scale. The grating line positions can be defined by the equation $X_n = n \cdot P + \delta_n$. These displacements $\delta_n$ of the grating line positions of the scanning graduation cause a phase shift of the associated signal portion and are selected such that, in the superposition of all signal portions, individual or all harmonics are substantially suppressed. The various methods for harmonic filtering based on this principle have different functional dependencies between the displacement $\delta_n$ and the grating line index n. For example, for a Vernier filter, $\delta_n$ can be defined by the equation $\delta_n = n \cdot \alpha \cdot P$, where $\alpha \ll 1$. For an arcsin filter, $\delta_n$ can be defined by the equation $\delta_n = P/2\pi \cdot \arcsin(n/N)$, where n=−N ... +N.

A constant increase or decrease of the displacement $\delta_n$ with an increasing grating line index n is common to all these methods. The result of this is that signal portions with a larger phase difference are generated at scanning positions which are far apart from each other. Thus a noticeable filtering effect is only assured if the signal portions of a relatively large scanning region are superimposed evenly and without interference. However, interferences occur frequently in actuality which greatly impair the filtering effects. Such interferences result from uneven intensity of illumination within the scanning graduation, illumination of the scanning graduation by a decollimated (divergent or convergent) light beam and local flaws in the scanning or scale graduation, for example.

These interferences not only reduce the filtering effect, they also displace the phase relation of the signal composed of the individual phase-shifted portions thereby further reducing signal quality.

SUMMARY OF THE INVENTION

According to a first aspect of the invention, there is provided a measuring system for obtaining signals that are substantially free of harmonics. The system includes a measuring scale having a periodic graduation and a scanning unit for scanning the measuring scale. The scanning unit has an aperiodic scanning graduation formed by a plurality of windows of equal width. Each window has one grating line disposed therein. Each grating line has an index number n which represents the sequence number of the grating line from a reference point wherein each grating line is displaced from a leading edge of its respective window by an amount $\delta_m$ which is defined by an equation dependent upon n. For at least one grating line the n upon which $\delta_m$ is calculated is different from the n representing the index number of that grating line so that the sequence of grating line displacements deviates from an ordered sequence.

According to another aspect of the invention, there is provided a device for obtaining signals which are free of harmonics up to a predetermined bandwidth including at least one non-periodic scanning graduation for scanning a periodic graduation wherein the grating lines of the scanning graduation have a grating line displacement with respect to the periodic graduation such that the sequence of grating line displacements deviates from an ordered sequence.

According to still another aspect of the invention, there is provided a measuring system for obtaining signals that are substantially free of harmonics including a measuring scale having a periodic graduation and a scanning unit for scanning the measuring scale. The scanning unit includes an aperiodic scanning graduation formed by a plurality of windows of equal width, each window having a grating line disposed therein. Each grating line is displaced from a leading edge of its respective window in the measuring direction wherein the grating line displacement does not constantly increase or decrease with respect to a reference point on the scanning graduation.

In particular, the present invention is directed to an improved measuring system in which harmonic-free periodic signals are recovered which does not require special optical elements for this purpose and which is widely applicable through a broad range of types of measuring instruments.

It is an object of the invention to disclose a device for filtering harmonics which retains a high degree of filtering effects even in case of the above mentioned interferences, and which hardly changes the phase relation of the combined signal.

The present invention has the advantage that periodic signals substantially free of harmonics are obtained in a simple manner by altering conventional position measuring elements without requiring additional elements such as frequency filter masks, for example. In addition, special demands are not made on the accuracy of the graduation.

The invention itself, together with objects and attendant advantages, will best be understood by reference to the following detailed description taken in conjunction with the accompanying drawings. It should be understood, however, that this description is to be illustrative rather than limiting, the scope of the invention being defined by the appended claims and equivalents thereof.

DETAILED DESCRIPTION OF THE PRESENTLY PREFERRED EMBODIMENTS

Figure 1:
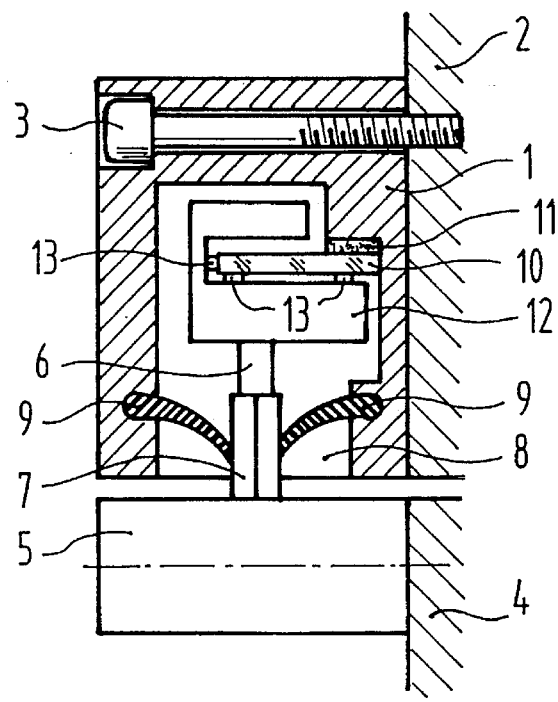
FIG. 1 is a cross-sectional view of a length measuring system suitable for use with the present invention.

FIG. 1 is a cross-sectional view of a length measuring system suitable for use with the present invention. The measuring system includes a housing 1 in the shape of a hollow profiled section which is fastened on a base 2 of a machining tool (not shown) by means of a bolt or screw connection 3. This processing machine includes a slide piece or carriage 4 to which is fastened in an arbitrary manner an assembly or mounting base 5. The assembly base 5 serves to mount a follower 6 which defines a sword shaped tapered portion 7 which extends through a slit 8 defined in the otherwise completely enclosed housing 1. Elastic sealing lips 9 are mounted on the housing 1 so as to close the slit 8 around the tapered section 7, thereby preventing the penetration of contaminants into the interior of the housing 1. A measuring scale 10 is mounted on an inner surface of the housing 1 by means of an elastic adhesive layer 11. A scanning unit 12 is secured to the follower 6 and is guided for motion along the measuring scale 10 by means of rollers 13. Relative movement between the slide piece 4 and the bed 2 is transferred by the follower 6 to the scanning unit 12.

Figure 2:
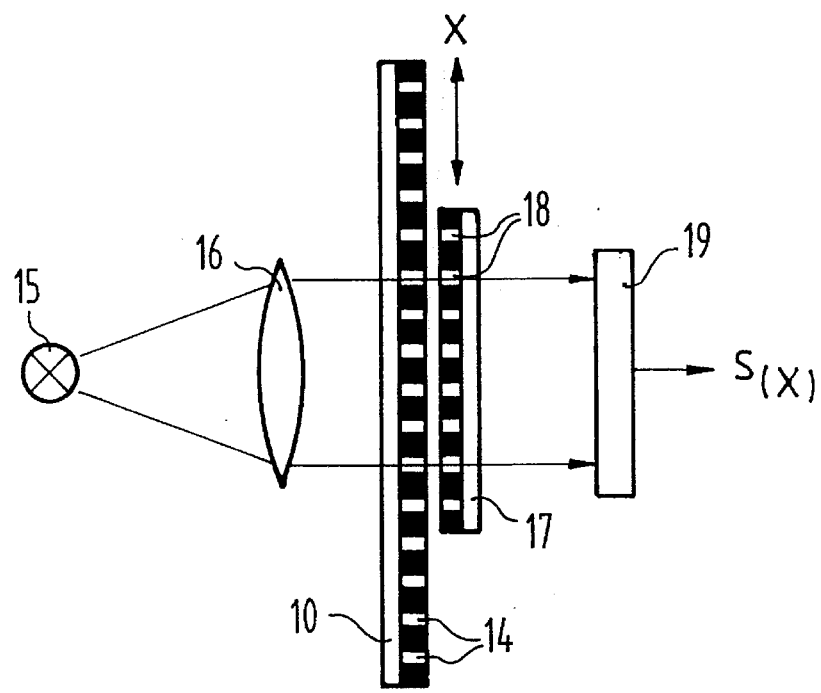
FIG. 2 is a schematic representation of a portion of a scanning unit included in the length measuring system shown in FIG. 1.

FIG. 2 is a schematic representation of a portion of a scanning unit included in the length measuring system shown in FIG. 1. The scanning unit 12 operates to scan a graduation 14 defined by the measuring scale 10. For this purpose, the scanning unit 12 includes a light source 15, a condenser lens 16, a scanning plate 17 with a scanning graduation 18 and a photoelectric element 19. The light beam emanating from the light source 15 is aligned parallel by the condenser lens 16, passes through the graduations 14 and 18 of the scale 10 and the scanning plate 17 respectively and then falls on the photoelectric element 19. During a movement of the scanning unit 12 with the scanning plate 17 in the measuring direction illustrated by arrow X with relation to the stationary scale 10, the light beam is modulated at the graduations 14 and 18 so that the photoelectric element 19 delivers a periodic electrical analog signal S(X), which is evaluated, counted and displayed in digital form by the measuring system in order to determine a measured position value characteristic of the position of the scanning unit 12 with respect to the measuring scale 10.

In general, the periodic analog signal S(X) generated by the photoelectric element 19 includes harmonics or harmonic components, for example, due to inaccuracies of the graduations 14 and 18. This analog signal S(X) can be represented in general as a function of the position along the measuring direction X by the Fourier series by equation (1) below:

$$S(X) = a_o + \sum_{k=1}^{N} (a_k \cos kx + b_k \sin kx). \quad (1)$$

The running summation index k is the order number of the waves or frequencies. Thus, for example, the base or fundamental wave component corresponds to k=1, the first harmonic component corresponds to k=2, and so forth. In equation (1), $a_k$ and $b_k$ are the Fourier coefficients.

As previously discussed, mathematical filtering such as that disclosed in U.S. Pat. No. 4,602,436 relies on a constant increase or decrease of the displacement $\delta_n$ with an increasing grating line index. The scanning graduation is formed by a plurality of windows of equal width shown by the dotted boxes in FIG. 3. Each window has a grating line disposed therein. Each grating line has an index number which represents the sequence number of the grating line from an arbitrary reference point. The individual grating lines n of the scanning graduation 18 are displaced in the measuring direction X by a small amount $\delta_n$ with respect to the set position of the associated periodic measuring graduation which the scanning graduation scans. With specific reference to U.S. Pat. No. 4,602,436, $\delta_n$ is defined by the following equation:

$$\delta_n = P/2\pi \cdot arcsin\ (n/N),\ where\ n = -N \ldots +N.$$

Figure 3:
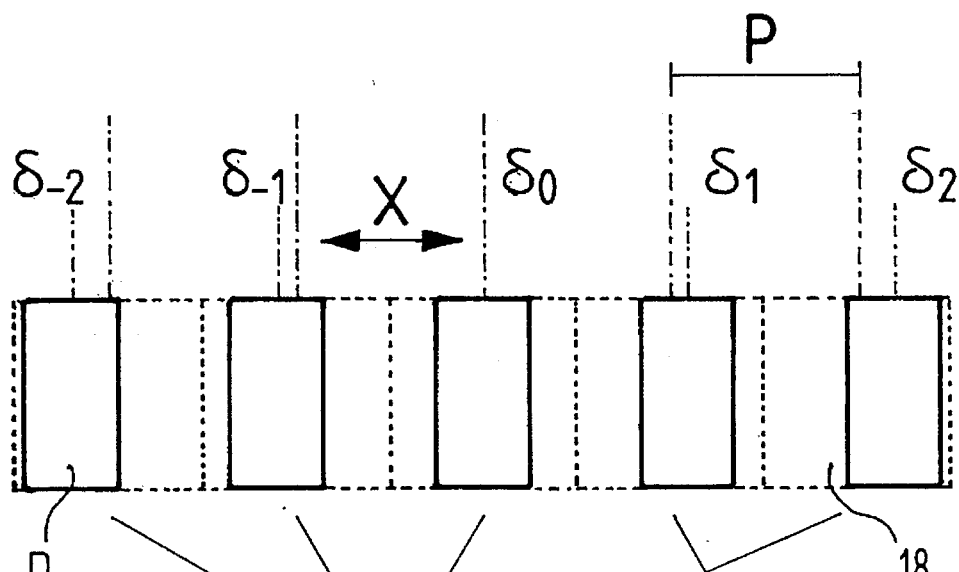
FIG. 3 is a schematic representation of an "ordered" scanning graduation.

Such a scanning graduation is illustrated in FIG. 3. The grating line displacements $\delta_n$ have been calculated in accordance with the above mentioned function and thus constantly increase or decrease with respect to an increasing or decreasing grating line index and thus form an "ordered" sequence.

While such an ordered scanning graduation substantially suppresses harmonics, there are several disadvantages due to the "ordered" sequence of the scanning graduation. Such disadvantages include the fact that signal portions with a larger phase difference are generated at scanning positions which are far apart from each other. Thus a noticeable filtering effect is only assured if the signal portions of a relatively large scanning region are superimposed evenly and without interference. However, interferences occur frequently in actuality which greatly impair the filtering effects. Such interferences result from uneven intensity of illumination within the scanning graduation, illumination of the scanning graduation by a decollimated light beam and local flaws in the scanning or scale graduation, for example.

Figure 4:
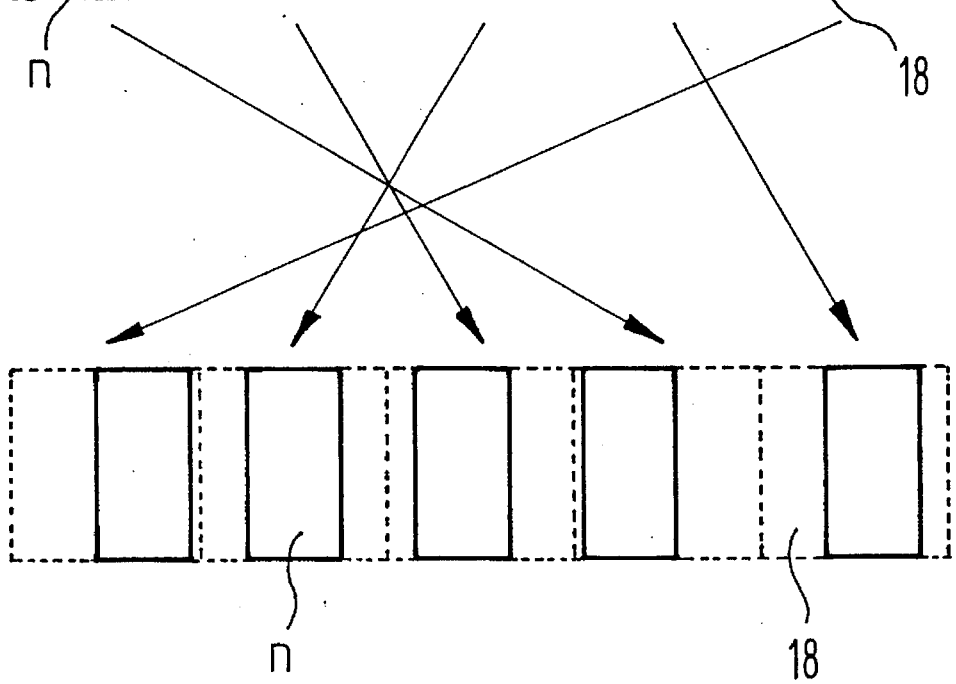
FIG. 4 is a schematic representation of a non-periodic scanning graduation according to a preferred embodiment of the present invention.

It has been found that the filtering effect remains unchanged when the grating line displacements $\delta_{n(1)}$ and $\delta_{n(2)}$ of two arbitrary grating lines n(1) and n(2) are interchanged as shown in FIG. 4. As shown in FIG. 4, the scanning graduation 18 according to a preferred embodiment of the present invention is constructed by mixing the sequence of grating line displacement of an "ordered" sequence such as that shown in FIG. 3. It was found that the filtering effect was maintained even though the sequence of the grating line displacements were mixed because the filtering effect is based on the frequency distribution of the grating line displacements which is not dependent upon the sequence of the grating line displacements.

Thus unlike the "ordered" scanning graduation shown in FIG. 3, the scanning graduation 18 shown in FIG. 4 generates signals with a relatively large phase difference at closely adjacent scanning positions. The interferences occurring in actual use therefore impair the individual phase-shifted signal portions evenly to a large extent, so that the filtering effect is maintained. Also, such interference no longer greatly displaces the phase relation of the combined signal.

Although the present invention has been described with respect to "mixing" the sequence of the arcsin filter shown in FIG. 3, "mixing" of the grating line displacements according to the present invention can be transferred to all filtering methods based on the principle of grating lines displacement. Mixing according to the present invention can be performed in a statistical manner. However, it can also be performed in a deterministic manner as long as it remains assured that the grating line displacements within an arbitrary partial region of the scanning graduation correspond to as evenly as possible distributed positions within the original ordered sequence of grating line displacements.

Within the scope of the invention it is not only possible to mix the sequence of the grating line displacements, it is also possible to determine the grating line positions directly with the aid of a statistical or pseudo-statistical method. In the course of this it is necessary to select the distribution function, i.e. the probability that a defined displacement is assigned to a grating line, in an appropriate manner, since it determines the filtering effect of the scanning graduation. For example, rectangular or cosine shaped distribution functions are advantageous.

In a preferred embodiment each grating line n has substantially the same width. In addition, according to a preferred embodiment, the mean scanning line displacement of

What is claimed is:

1. A measuring system for obtaining signals that are substantially free of harmonics comprising:

a measuring scale having a periodic graduation; and a scanning unit for scanning the measuring scale and generating said signals, the scanning unit having an aperiodic scanning graduation formed by a plurality of windows of equal width, each window having one grating line disposed therein, each grating line having an index number n which represents the sequence number of the grating line from a reference point wherein each grating line is displaced from a leading edge of its respective window by an amount $\delta_m$ which is defined by an equation dependent upon n, where for at least one grating line, the n upon which $\delta_m$ is calculated is different from the n representing the index number of that grating line so that the sequence of grating line displacements deviates from an ordered sequence and so that said output signals are substantially free of harmonics.

2. A system according to claim 1 wherein $\delta_m$ is defined by the equation $\delta_m = P/2\pi \arcsin(n/N)$, where P is the graduation period of the measuring scale and $n = -N \ldots +N$.

3. A system according to claim 1 wherein $\delta_m$ is defined by the equation $\delta_m = n \cdot \alpha \cdot P$, where $\alpha \ll 1$ and P is the graduation period of the measuring scale.

4. A system according to claim 1 wherein each grating line has the same width.

5. A system according to claim 1 wherein the aperiodic scanning graduation is determined by mixing up an ordered sequence.

6. A system according to claim 5 wherein the mixing is performed statistically.

7. A system according to claim 5 wherein the mixing is performed pseudo-statistically.

8. A system according to claim 1 wherein the aperiodic scanning graduation has a frequency distribution that extends rectangularly or cosine-shaped.

9. A system according to claim 1 wherein the mean scanning line displacement of an arbitrary partial section of at least ten grating lines is less than ¼ of the mean grating line distance.

10. A device for obtaining signals which are free of harmonics up to a predeterminable bandwidth comprising:

at least one non-periodic scanning graduation for scanning a periodic graduation and generating said signals, wherein the grating lines of the scanning graduation have a grating line displacement with respect to the periodic graduation such that the sequence of grating line displacements deviates from an ordered sequence and so that said output signals are free of harmonics up to said predeterminable bandwidth.

11. A device according to claim 10 wherein $\delta_m$ is defined by the equation $\delta_m = n \cdot \alpha \cdot P$, where $\alpha \ll 1$ and P is the graduation period of a measuring scale.

12. A device according to claim 10 where $\delta_m$ is defined by the equation $\delta_m = P/2\pi \cdot \arcsin(n/N)$, where P is the graduation period of a measuring scale and $n = -N \ldots +N$.

13. A device according to claim 10 wherein each grating line has the same width.

14. A device according to claim 10 wherein the aperiodic scanning graduation is determined by mixing up an ordered sequence.

15. A device according to claim 14 wherein the mixing is performed statistically.

16. A device according to claim 14 wherein the mixing is performed pseudo-statistically.

17. A device according to claim 10, characterized in that the sequence of grating line displacements is directly determined.

18. A device according to claim 10 wherein the frequency distribution of the grating lines displacements extends rectangularly or cosine-shaped.

19. A device according to claim 10, wherein the mean scanning line displacement of an arbitrary partial section of at least ten grating lines is less than ¼ of the mean grating line distance.

20. A measuring system for obtaining signals that are substantially free of harmonics comprising:

a measuring scale having a periodic graduation; and a scanning unit for scanning the measuring scale and generating said output signals, the scanning unit having an aperiodic scanning graduation formed by a plurality of windows of equal width, each window having a grating line disposed therein which is displaced from a leading edge of its respective window in the measuring direction wherein the grating line displacement does not constantly increase or decrease with respect to a reference point on the scanning graduation and so that said output signals are substantially free of harmonics.

* * * * *

UNITED STATES PATENT AND TRADEMARK OFFICE
CERTIFICATE OF CORRECTION

PATENT NO. : 5,583,798
DATED : December 10, 1996
INVENTOR(S) : Franz et al.

It is certified that error appears in the above-indentified patent and that said Letters Patent is hereby corrected as shown below:

<u>In the Claims</u>

In Claim 3, column 7, line 34, delete "$\alpha<<1$" and substitute therefor --$\alpha \ll 1$--.

Signed and Sealed this

Seventeenth Day of March, 1998

*Attest:*

BRUCE LEHMAN

*Attesting Officer*  *Commissioner of Patents and Trademarks*